(12) United States Patent
Kim (10) Patent No.: US 7,767,558 B2
(45) Date of Patent: Aug. 3, 2010

(54) METHOD OF CRYSTALLIZING AMORPHOUS SILICON AND DEVICE FABRICATED USING THE SAME

(75) Inventor: Young-Joo Kim, Dae-gu (KR)

(73) Assignee: LG Display Co., Ltd., Seoul (KR)

(*) Notice: Subject to any disclaimer, the term of this patent is extended or adjusted under 35 U.S.C. 154(b) by 337 days.

(21) Appl. No.: 11/822,297

(22) Filed: Jul. 3, 2007

(65) Prior Publication Data

US 2007/0293024 A1 Dec. 20, 2007

Related U.S. Application Data

(62) Division of application No. 10/717,676, filed on Nov. 21, 2003, now abandoned.

(30) Foreign Application Priority Data

Nov. 25, 2002 (KR) .................. 10-2002-0073554

(51) Int. Cl.
*H01L 21/20* (2006.01)
(52) U.S. Cl. .................. 438/486; 438/166; 438/488; 257/E21.133
(58) Field of Classification Search .................. 438/149, 438/166, 482, 486–489; 257/E21.133
See application file for complete search history.

(56) References Cited

U.S. PATENT DOCUMENTS

| | | | |
|---|---|---|---|
| 5,208,690 A | 5/1993 | Hayashi et al. | |
| 6,177,301 B1 | 1/2001 | Jung | |
| 6,693,258 B2 * | 2/2004 | Sugano et al. | ........... 219/121.8 |
| 2004/0192013 A1 * | 9/2004 | Ryu et al. | .................. 438/478 |

FOREIGN PATENT DOCUMENTS

| | | |
|---|---|---|
| KR | 2001-0066251 | 7/2001 |
| KR | 2001-0087667 | 9/2001 |

OTHER PUBLICATIONS

H. Ikeda, "Evaluation of Grain Boundary Trap States in Polycrystalline-Silicon Thin-Film Transistors by Mobility and Capacitance Measurements." *Journal of Applied Physics*. vol. 91, No. 7, Apr. 2002, pp. 4637-4645.
R. Sposili, et al., Single=Crystal S1 Films Via a Low-Substrate-Temperature Excimer-Laser Crystallization Method, Mat. Res. Soc. Symp. Proc. vol. 542, 956, pp. 953-958.
Mutsuko Hatano, et al., "Excimer laser-induced temperature filed in melting and resolidification of silicon thin films", Journal of Applied Physics, Jan. 1, 2000, pp. 36-43, vol. 87, No. 1, American Institute of Physics.

* cited by examiner

*Primary Examiner*—Thanhha Pham
(74) *Attorney, Agent, or Firm*—McKenna Long & Aldridge LLP

(57) ABSTRACT

A method of crystallizing amorphous silicon includes forming an amorphous silicon film over a substrate, crystallizing the amorphous silicon film to form a polycrystalline silicon film using a sequential lateral solidification crystallization method, and performing a surface treatment to the polycrystalline silicon film, wherein the sequential lateral solidification crystallization method includes at least a first application of a first laser beam having a first energy density that completely melts a first uncrystallized portion of the amorphous silicon film and melts a first crystallized portion of the amorphous silicon film, and the surface treatment includes application of a second laser beam having a second energy density that partially melts an entire surface of the polycrystalline silicon film.

10 Claims, 7 Drawing Sheets

METHOD OF CRYSTALLIZING AMORPHOUS SILICON AND DEVICE FABRICATED USING THE SAME

This application is a divisional of application Ser. No. 10/717,676, filed Nov. 21, 2003 now abandonded, which claims priority to Korean Patent Application No. 10-2002-0073554, filed Nov. 25, 2002, each of which are incorporated by reference for all purposes as if fully set forth herein.

BACKGROUND OF THE INVENTION

1. Field of the Invention

The present invention relates to a method of crystallizing silicon and a device fabricated using a method of crystallizing silicon, and more particularly, to a method of crystallizing amorphous silicon and a display device fabricated using a method of crystallizing amorphous silicon.

2. Discussion of the Related Art

Currently, demand for flat panel display devices that are thin, lightweight, and have low power consumption is increasing. In general, the flat panel display devices may be classified into two different categories based upon how light is produced. A first type of flat panel display devices include a light-emitting display device that emits light to display images, and a second type of flat panel display devices includes a light-receiving display device that uses external light sources to display images. For example, plasma display panel (PDP) devices, field emission display (FED) devices, and electro-luminescence display (ELD) devices are light-emitting displays, and liquid crystal display (LCD) devices are light-receiving displays.

The LCD devices are commonly used in laptop computers and as desktop computer monitors because of their superior resolution, color range, and image quality. The LCD devices make use of optical anisotropy and polarization properties of liquid crystal molecules to produce images. The liquid crystal molecules have a definite orientational alignment as a result of their long, thin shapes, and can be controlled by application of an electric field. Accordingly, the alignment of the liquid crystal molecules may be controlled by changing the applied electric field, wherein refraction of incident light is dependent upon the orientational alignment of the liquid crystal molecules. Thus, by properly controlling the applied electric field, a desired image can be produced.

Of the various types of LCD devices, active matrix liquid crystal display (AM-LCD) devices having thin film transistors (TFTs) and pixel electrodes arranged in a matrix configuration are commonly used because they can produce high quality images at reasonable costs. The TFTs commonly include polycrystalline silicon (p-Si) or amorphous silicon (a-Si) used as an active layer. Since amorphous silicon (a-Si) can be deposited at a low temperature to form a thin film on a glass substrate, it is commonly used for switching elements in the LCD devices. However, amorphous silicon (a-Si) is problematic when used in large-area LCD devices since amorphous silicon (a-Si) TFTs have relatively slow display response times, thereby limiting their suitability for the large-area LCD devices. In contrast, polycrystalline silicon TFTs provide much faster display response times and are well suited for use in the large-area LCD devices, such as laptop computers and wall-mounted televisions, which require greater field effect mobility. For example, the large-area LCD devices often require TFTs having field effect mobility greater than 30 $cm^2/Vs$ together with low leakage current.

During the formation of polycrystalline silicon for LCD device, laser treatment techniques are commonly used, wherein the polycrystalline silicon also can be used in the driving circuits for the TFT switching devices. Since polycrystalline silicon films are composed of crystal grains having grain boundaries, the larger the grains and the more regular the grain boundaries are the better the field effect mobility. Thus, a silicon crystallization method that produces large grains, which would result in formation of a single crystal, would be valuable.

In a conventional process for forming a polycrystalline silicon layer, an intrinsic amorphous silicon layer is formed on an insulating substrate using a plasma chemical vapor deposition (PCVD) method or using a low pressure chemical vapor deposition (LPCVD) method. After the amorphous silicon layer is formed to have a thickness of about 500 Å (angstroms), it is re-crystallized into a polycrystalline silicon layer by using a crystallization method. The crystallization method is generally classified into one of an excimer laser crystallization (ELC) method, a solid phase crystallization (SPC) method, a metal induced crystallization (MIC) method, and a metal induced lateral crystallization (MILC) method.

In the ELC method, an insulating substrate having an amorphous silicon layer formed thereon is heated to a temperature of about 250° C. Then, an excimer laser beam is applied to the amorphous silicon layer to form a polycrystalline silicon layer. In the SPC method, the amorphous silicon layer is heat-treated at a high temperature for a long period of time to become crystallized into a polycrystalline silicon layer. In the MIC method, a metal layer is deposited on the amorphous silicon layer and the deposited metal is used for crystallization of the amorphous silicon layer, wherein large-sized glass substrates can be used as an insulating substrate for the amorphous silicon layer. In the MILC method, a metal is first formed on an amorphous silicon layer, and the amorphous silicon layer is crystallized into polycrystalline silicon by lateral growth of grains. In addition, an oxide pattern is formed on a predetermined active portion of the amorphous silicon layer.

The ELC method also has been used during annealing of amorphous silicon. The excimer laser allows areas of an amorphous silicon film to be exposed to very high temperatures for very short periods of time. Thus, annealing of the amorphous silicon is performed at an optimum temperature (less than 400 degrees Celsius) without degrading the underlying substrate upon which the silicon amorphous film is formed. However, the ELC method causes lack of control over some of the process steps, wherein an aperture size of the excimer laser is relatively small. Accordingly, multiple laser passes or shots may be required to complete an annealing process due to the reduced aperture size, power of the excimer laser, and thickness of the amorphous silicon film. Thus, the multiple shots of the excimer laser introduces non-uniformities during the annealing process. Furthermore, the substrates must be serially annealed rather than simultaneously annealed in a furnace, thereby increasing production costs of the TFTs made by the ELC method.

In the SPC method, a buffer layer is formed on a quartz substrate, which can withstand temperatures higher than 600° C., to prevent contamination from the quartz substrate. Then, an amorphous silicon layer is deposited on the buffer layer and heat-treated in a furnace at a high temperature to form a polycrystalline silicon layer. However, since the SPC method is performed at high temperatures for an extended period of time, it is difficult to acquire a desired crystalline silicon phase. For example, since the crystalline grains develop without a continuous directionality, the polycrystalline silicon layer may have an irregular surface. Accordingly, a thin film transistor that includes a gate insulating layer covering the polycrystalline silicon layer will result in the gate insulating layer having irregularities, thereby decreasing a breakdown voltage of the thin film transistor. In addition, the size of the polycrystalline silicon grains formed by the SPC method are very irregular, thereby deteriorating electrical characteristics of a device using the polycrystalline silicon layer. Furthermore, since the quartz substrate used for the SPC method is very expensive, fabrication costs are increased.

Unlike the SPC method, which uses an expensive quartz substrate, the MIC and MILC methods may utilize a relatively inexpensive glass substrate for forming the polycrystalline silicon. However, in the MIC and MILC methods, metal impurities may remain in the polycrystalline silicon, thereby deteriorating the quality of the polycrystalline silicon layer.

Another method of crystallizing amorphous silicon into polycrystalline silicon is a sequential lateral solidification (SLS) method. Crystallization using the SLS method make use of the tendency of silicon grains to grow laterally from interfaces between liquid and solid silicon, thereby producing grain boundaries that are perpendicular to the interfaces. During the SLS method, amorphous silicon is crystallized using a laser beam having a magnitude and relative motion that melts amorphous silicon to form laterally grown silicon grains upon re-crystallization. The SLS method is disclosed in detail by Robert S. Sposilli, M. A. Crowder, and James S. Im, Mat. Res. Soc. Symp. Proc. Vol. 452, 956-957, 1997.

SUMMARY OF THE INVENTION

Accordingly, the present invention is directed to a method crystallizing amorphous silicon and a display device fabricated using a method of crystallizing amorphous silicon that substantially obviates one or more of problems due to limitations and disadvantages of the related art.

An object of the present invention is to provide a method of crystallizing an amorphous silicon film to eliminate micro particles within grain boundaries of a polycrystalline silicon film.

Another object of the present invention, is to provide a display device formed of crystallized amorphous silicon having improved grain boundaries.

Another object of the present invention is to provide a method of fabricating a polycrystalline silicon film having improved electrical characteristics.

Another object of the present invention is to provide a display device formed of a polycrystalline silicon film having improved electrical characteristics.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of crystallizing amorphous silicon includes forming an amorphous silicon film over a substrate, crystallizing the amorphous silicon film to form a polycrystalline silicon film using a sequential lateral solidification crystallization method, and performing a surface treatment to the polycrystalline silicon film, wherein the sequential lateral solidification crystallization method includes at least a first application of a first laser beam having a first energy density that completely melts a first uncrystallized portion of the amorphous silicon film and melts a first crystallized portion of the amorphous silicon film, and the surface treatment includes application of a second laser beam having a second energy density that partially melts an entire surface of the polycrystalline silicon film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the illustrated embodiments of the present invention, examples of which are illustrated in the accompanying drawings.

FIGS. 1A to 1D are plan views of an amorphous silicon film crystallized using an exemplary crystallization method according to the present invention. In FIGS. 1A to 1D, an amorphous silicon film may be crystallized using a sequential lateral solidification crystallization method according to the present invention.

Figure 1A:
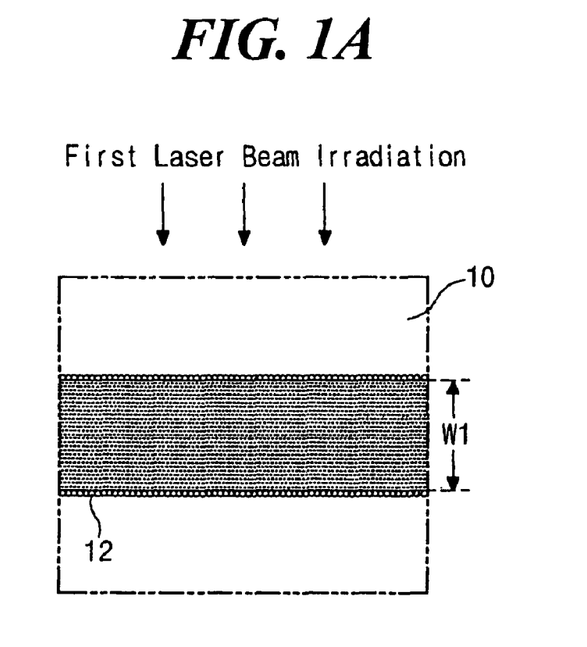
FIGS. 1A to 1D are plan views of an amorphous silicon film crystallized using an exemplary crystallization method according to the present invention.

In FIG. 1A, a first laser beam having a beam width W1 may be irradiated onto an amorphous silicon film 10, and an irradiated region of the amorphous silicon film 10 may be completely melted. The beam width WI may be several micrometers, for example, 2 or 3 micrometers, and irradiation of the laser beam may be performed for about several nanoseconds (i.e., a laser beam pulse duration time). Accordingly, during laser beam irradiation, a plurality of seeds 12 may be formed along edge portions (i.e., borders between liquid and solid phases of silicon) of the beam width W1.

Figure 1B:
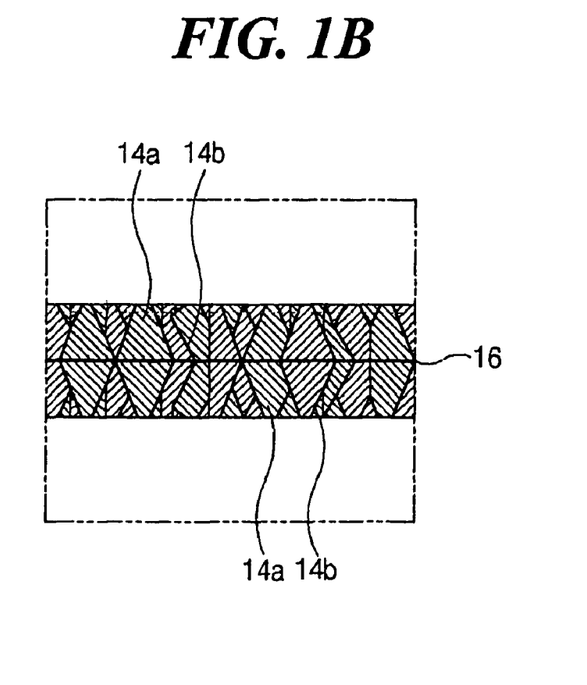

In FIG. 1B, a melted region of the amorphous silicon film 10 may be solidified to conduct a controlled super lateral growth (C-SLG) process. For example, a plurality of sub-grains 14a may grow along opposing directions toward a center line of the melted silicon region using the plurality of seeds 12 (in FIG. 1A). Accordingly, the sub-grains 14a growing from the opposite directions may collide in a center region, thereby forming a grain boundary 16 along the center line of the melted silicon region. In addition, adjacent sub-grains 14a may collide to form a plurality of sub-grain boundaries 14b, thereby forming a polycrystalline silicon thin film.

Figure 1C:
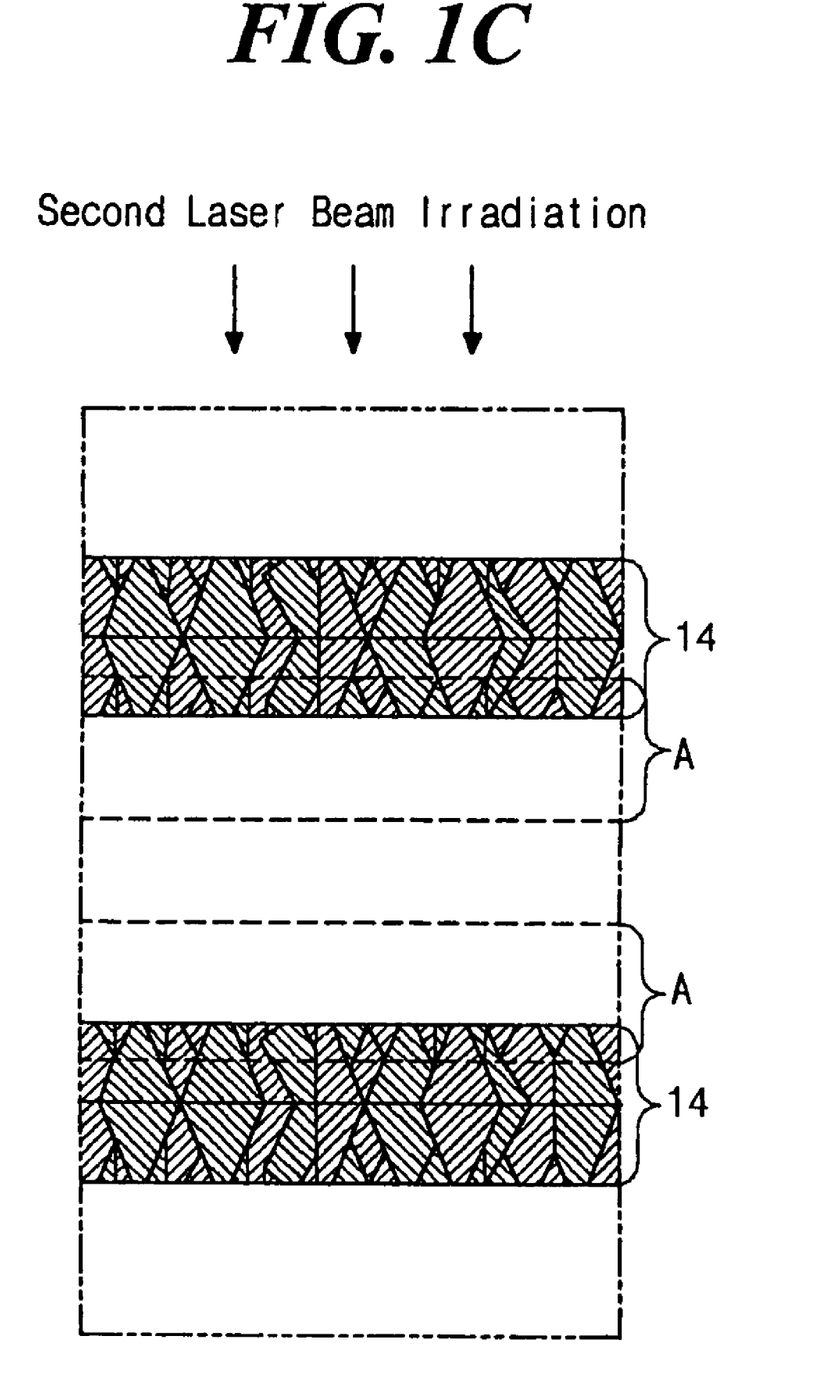

In FIG. 1C, a second laser beam irradiation may be conducted so that a second laser beam irradiates an overlapping portion of the previously-formed crystallized grain region 14 and a portion of a non-crystallized region. Accordingly, the second laser beam irradiation may completely melt the irradiated region, and the completely melted region may be crystallized similar to the crystallization described with respect to FIG. 1B.

Figure 1D:
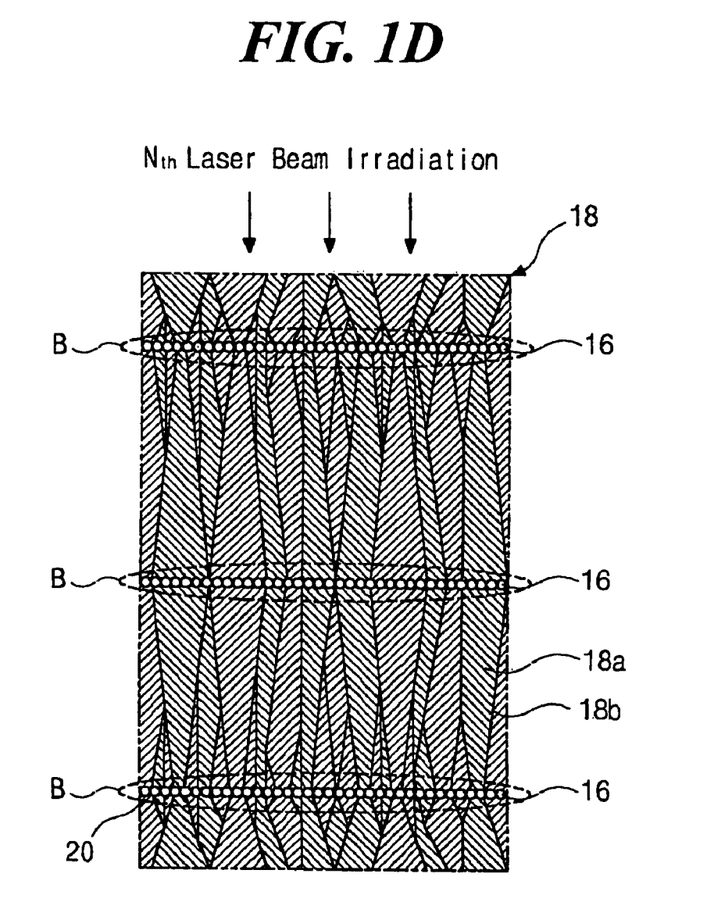

FIG. 1D shows a final state of the amorphous silicon crystallization after an Nth-number of laser beam irradiation processes. In FIG. 1D, a polycrystalline silicon thin film 18 having relatively large-sized grains 18a may be completed after repeating an Nth-number of the SLS crystallization processes. As a result, a first group of the large-sized grains 18a growing along the same direction collide with a second group of the large-sized grains 18a growing along the opposite direction. Thus, the oppositely grown first and second groups of the large-sized grains 18a may collide within regions B to form grain boundaries 18b.

Figure 2:
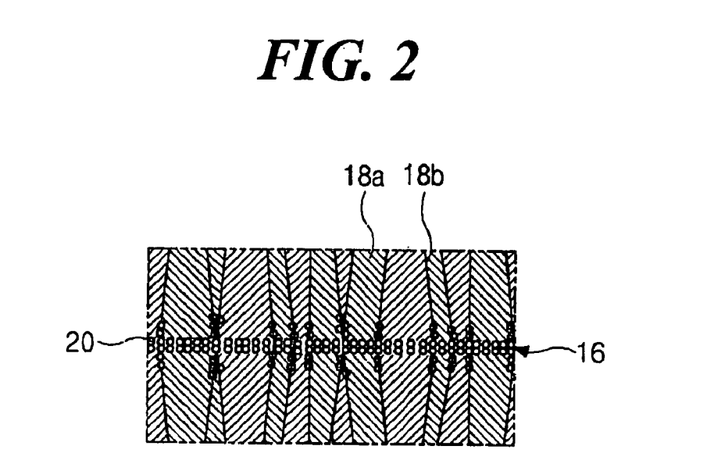
FIG. 2 is an enlarged view of regions B of FIG. 1D according to the present invention.

FIG. 2 is an enlarged view of regions B of FIG. 1D according to the present invention. In FIG. 2, when the melted silicon is re-solidified during the SLS crystallization processes, a plurality of particles 20 may be formed within the grain boundary 16. These particles 20 may have microscopic sizes and may function as defect sites within the polycrystalline silicon film 18. Although not shown, the microscopically sized particles 20 may be formed within the sub-grain boundaries 18b among the first and second groups of the large-sized grains 18a. Thus, if the polycrystalline silicon film 18 were to used as an active layer of a thin film transistor, electrical characteristics of the thin film transistor would become deteriorated.

Figure 3:
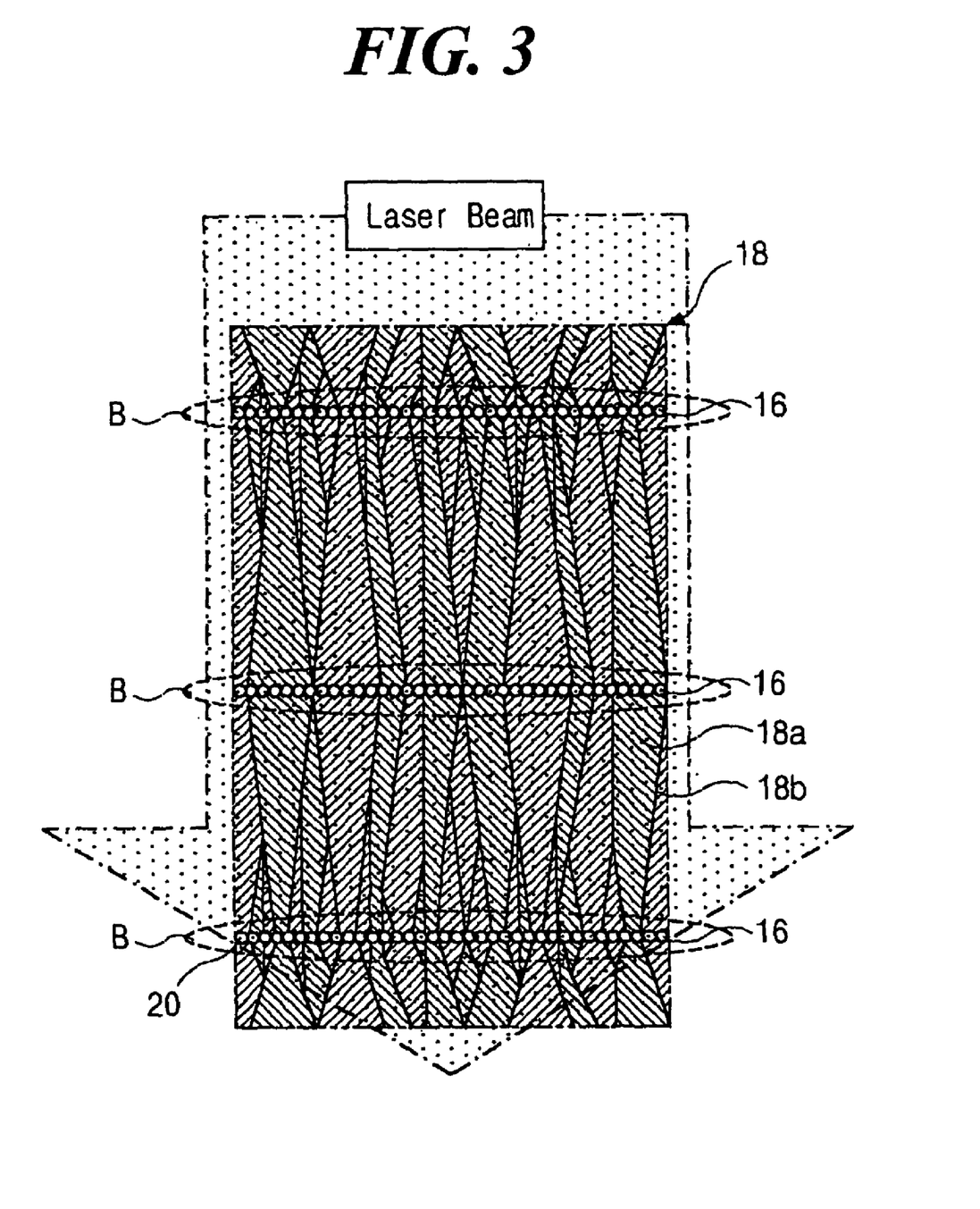
FIG. 3 is a plan view of an exemplary polycrystalline silicon film according to the present invention.

FIG. 3 is a plan view showing a polycrystalline silicon film being surface-treated according to the present invention. In FIG. 3, a surface treatment of the polycrystalline silicon film 18 may include irradiation of a first laser beam having a first beam width of about 2-3 micrometers and first beam energy density onto a first portion of the amorphous silicon film 10 (in FIG. 1A) to completely melt the first portion, wherein a pulse duration time of the laser beam may be several nanoseconds.

Next, a plurality of seeds may be generated along border regions (i.e., beam edges) between the completely melted silicon and the amorphous silicon 10. These seeds may function as nucleation cites during crystallization processes, thereby providing for growth of a plurality of grains along directions from the borders regions to a center portion of the amorphous silicon film 10. Accordingly, a first group of grains growing along a first direction may meet and collide with a second group of grains growing along a second direction opposite to the first direction, wherein the growth of the first and second groups of grains may stop within the center portion of the amorphous silicon film 10 to form a grain boundary.

Then, a second laser beam having the same energy density as the first laser beam may be irradiated onto a portion of the crystallized silicon and a portion of the amorphous silicon film 10. As previously described, the grains formed by irradiation of the first laser beam may grow larger, thereby increasing the size of each grain. Accordingly, large-sized grains may be produced by repeated irradiation of the first and second laser beams to form a single crystal having large-sized grains.

Figure 4A:
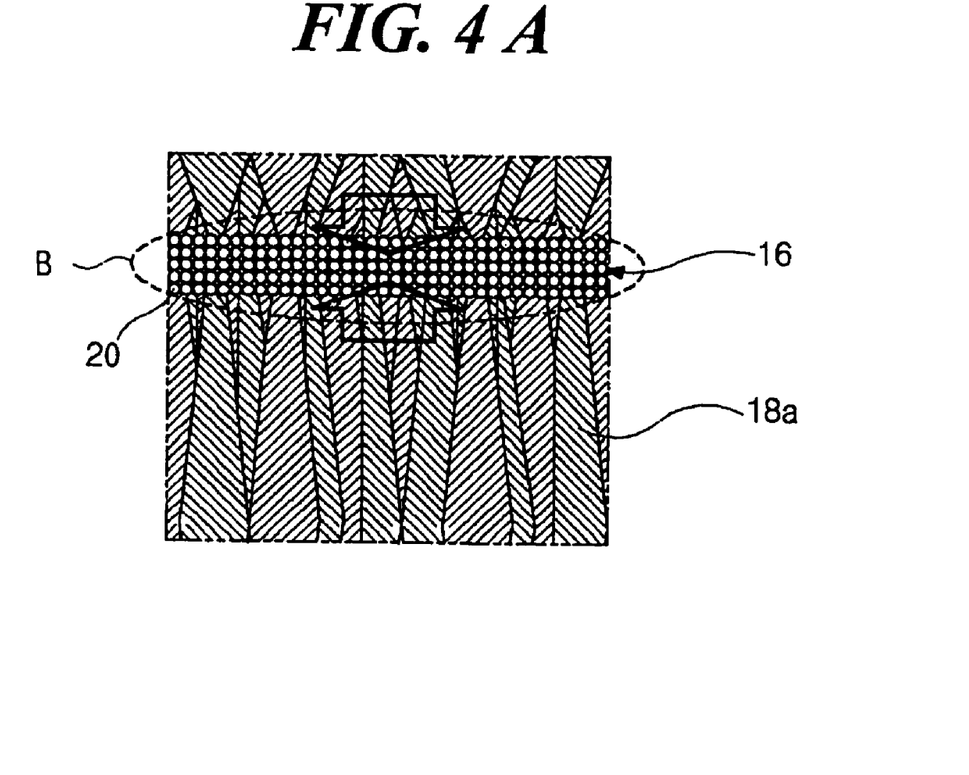
FIGS. 4A and 4B are enlarged views of portions B of FIG. 3 according to the present invention.
Figure 4B:
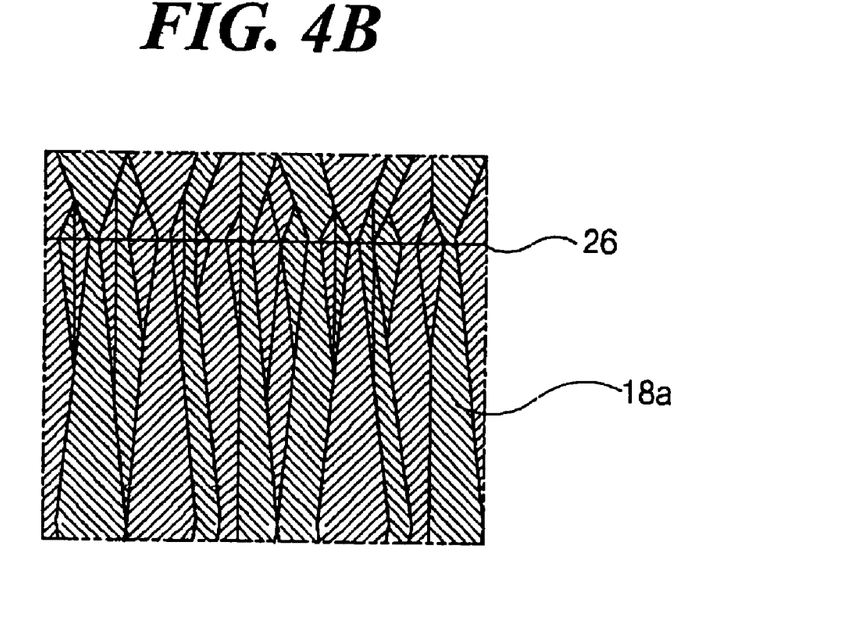

FIGS. 4A and 4B are enlarged views of portions B of FIG. 3 according to the present invention. In FIG. 4A, since the plurality of microscopic particles 20 may aggregate within the grain boundary 16 where the first and second groups of large-sized grains meet, defect sites B' may be formed along the grain boundary 16. Accordingly, a laser beam having a partial melting energy density may be applied to melt the defect sites B' and re-crystallize the grain boundary 16 along the first and second directions, as indicated by the arrow symbols. In FIG. 4B, the defect sites B' (in FIG. 4A) may be removed and the large-sized grains 18a may grow to contact each other along a new grain boundary 26. The surface treatment described with reference to FIGS. 3 and 4A-4B can be performed in the vacuum chamber to make the polycrystalline silicon surface be smooth.

Figure 5:
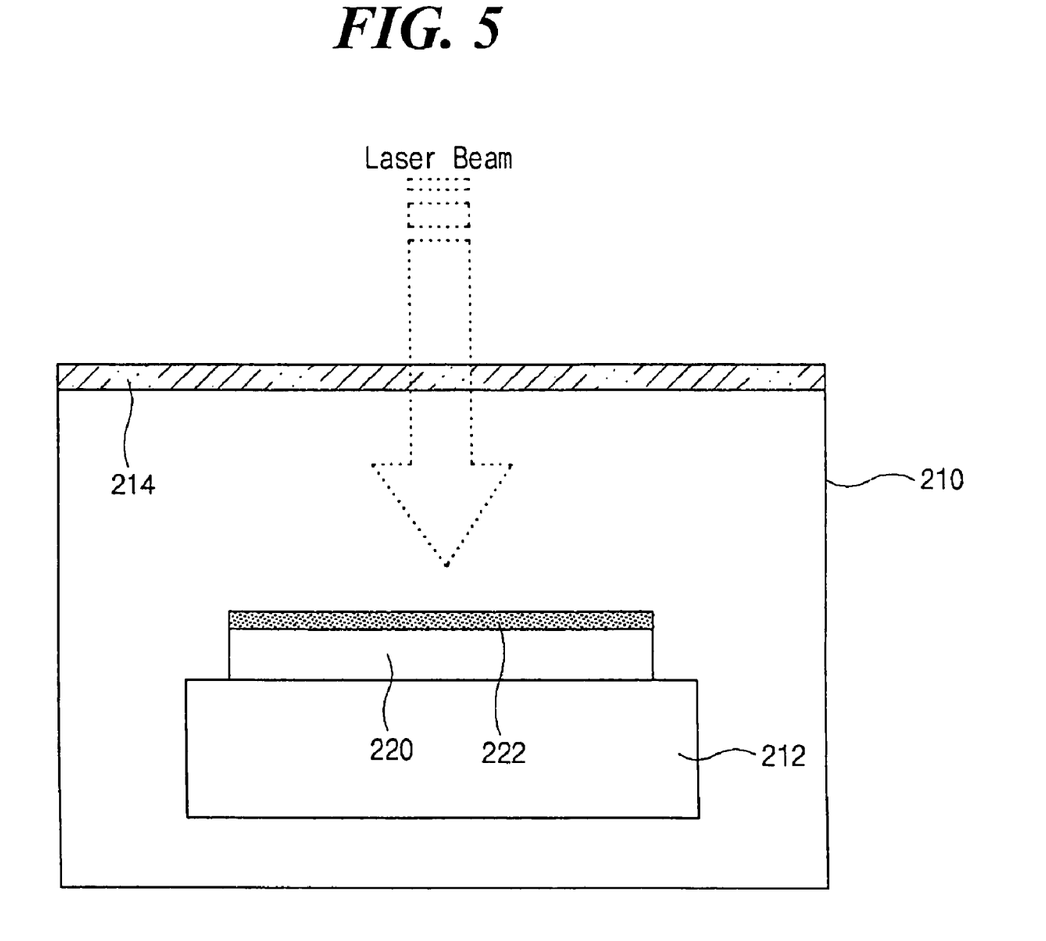
FIG. 5 is a schematic view of an exemplary surface treatment method of polycrystalline silicon according to the present invention.

FIG. 5 is a schematic view of an exemplary surface treatment method of polycrystalline silicon according to the present invention. The exemplary surface treatment processes of FIGS. 3, 4A, and 4B may be performed within a vacuum chamber to cause a surface of the polycrystalline silicon film to be smooth. In FIG. 5, a stage 212 may be disposed within a vacuum chamber 210, and a substrate 220 having a polycrystalline silicon film 222 may be disposed on the stage 212. The polycrystalline silicon film 222 may be formed using the SLS crystallization process detailed above. A dielectric window 214 may be disposed on a top portion of the vacuum chamber 210 to form an air/vacuum tight seal with the top portion of the vacuum chamber 210. In addition, the dielectric window 214 may not interrupt transmission of a laser beam during the surface treatment processes. An interior of the vacuum chamber 210 may be filled with inert gas. If the surface treatment is performed in ambient atmosphere, an oxidation reaction will occur along the surface of the polycrystalline silicon film when the laser beam partially melts and re-crystallizes the polycrystalline silicon film, thereby increasing surface roughness of the polycrystalline silicon film.

Figure 6:
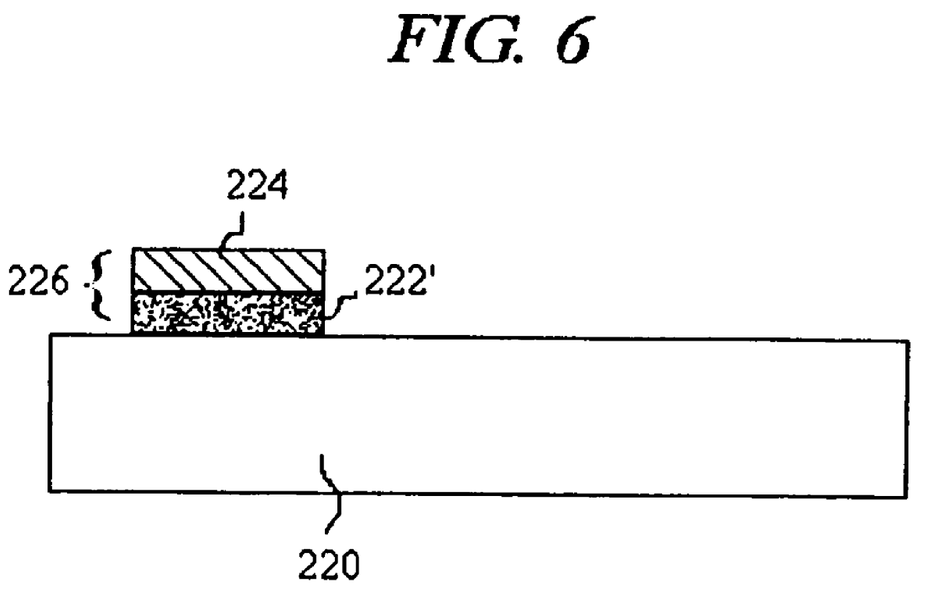
FIG. 6 is a view showing a portion of a display panel including thin film transistors.

FIG. 6 shows a portion of a liquid crystal display panel including a substrate 220 and a thin film transistor 226. The thin film transistor includes polycrystalline silicon film 222' and gate insulating layer 224.

It will be apparent to those skilled in the art that various modifications and variations can be made in the method crystallizing amorphous silicon and display device fabricated using a method of crystallizing amorphous silicon of the present invention without departing from the spirit or scope of the inventions. Thus, it is intended that the present invention cover the modifications and variations of this invention provided they come within the scope of the appended claims and their equivalents.

What is claimed is:

1. A method of crystallizing amorphous silicon, comprising:

forming an amorphous silicon film over a substrate;

crystallizing the amorphous silicon film to form a polycrystalline silicon film using a sequential lateral solidification crystallization method, wherein the sequential lateral solidification crystallization method includes at least a first application of a first laser beam having a first energy density that completely melts a first uncrystallized portion of the amorphous silicon film and melts a first crystallized portion of the amorphous silicon film, wherein the first application of the first laser beam forms a plurality of seeds along first border regions between solid and liquid phases of the amorphous silicon film, wherein the first uncrystallized portion of the amorphous silicon film is crystallized within a second region along a direction from the first border regions toward a center portion of the first uncrystallized portion using the plurality of seeds as nucleation cites during the first application of the first laser beam, wherein the second region includes a plurality of first sub-grains having a first size and a plurality of first sub-grain boundaries, wherein the sequential lateral solidification crystallization method includes at least a second application of the first laser beam that grows the first sub-grains to form a plurality of second sub-grains having a second size greater than the first size, wherein a first group of the second sub-grains grow along a first direction to contact a second group of the second sub-grains that grow along a second direction substantially opposite to the first direction, and wherein the first and second groups of second sub-grains form a second sub-grain boundary, wherein the plurality of first sub-grain boundaries are disposed among the plurality of first sub-grains and among the plurality of second sub-grains, and wherein the plurality of first sub-grain boundaries and the second sub-grain boundary include a plurality of microscopic defect particles; and performing a surface treatment to the polycrystalline silicon film, wherein the surface treatment includes application of a second laser beam having a second energy density that has a partial melting energy density to melt defect sites in the polycrystalline silicon film, wherein the application of the second laser beam partially melts and re-crystallizes the polycrystalline silicon film and removes the plurality of microscopic defect particles to smoothen the surface of the polycrystalline silicon film.

2. The method according to claim 1, wherein the surface treatment maintains polycrystalline characteristics of the plurality of second sub-grains.

3. The method according to claim 2, wherein the surface treatment forms a new grain boundary within a region where the first and second groups of second sub-grains directly contacts each other.

4. The method according to claim 1, wherein the first laser beam has a beam width of about 2 to 3 micrometers.

5. The method according to claim 1, wherein the surface treatment is performed within a vacuum chamber.

6. The method according to claim 5, wherein the vacuum chamber includes inert gas.

7. The method according to claim 5, wherein the vacuum chamber includes a dielectric window on a top portion of the vacuum chamber and a stage within an interior of the vacuum chamber.

8. The method according to claim 7, wherein the dielectric window provides an air/vacuum tight seal with the vacuum chamber, and the substrate is disposed on the stage.

9. The method according to claim 5, further comprising:
disposing the polycrystalline silicon film formed by the first laser beam over the stage of the vacuum chamber; and
applying the second laser beam along an entire surface of the polycrystalline silicon film disposed in the vacuum chamber.

10. The method according to claim 9, wherein the application of the second laser beam is through the dielectric window of the vacuum chamber.

* * * * *